United States Patent [19]

Bowden

[11] 4,011,506
[45] Mar. 8, 1977

[54] TV SERVICE TRIGGERED OSCILLOSCOPE

[76] Inventor: Ralph H. Bowden, 1800 Edgewood Road, Sioux Falls, S. Dak. 57107

[22] Filed: Feb. 12, 1975

[21] Appl. No.: 549,348

[52] U.S. Cl. .............................. 324/121 R; 358/10
[51] Int. Cl.² ................... G01R 13/22; H04N 9/02
[58] Field of Search ......... 324/121 R, 128; 358/10; 178/DIG. 4

[56] References Cited
OTHER PUBLICATIONS

Tektronix Catalog; 1971; p. 194; Tektronix Inc., Beaverton, Oregon 97005.

*Primary Examiner*—R. V. Rolinec
*Assistant Examiner*—Ernest F. Karlsen
*Attorney, Agent, or Firm*—Edmond T. Patnaude

[57] ABSTRACT

There is described a triggered sweep oscilloscope for television service use employing sync pulse triggered internal sweep circuits selected by push buttons on the front panel of the instrument.

8 Claims, 6 Drawing Figures

TV SERVICE TRIGGERED OSCILLOSCOPE

The present invention relates in general to triggered sweep oscilloscopes, and it relates more particularly to a new and improved oscilloscope for use in servicing television equipment.

BACKGROUND OF THE INVENTION

Servicing of television equipment is greatly facilitated by observing on an oscilloscope the wave forms present at various locations in the overall circuit. While triggered sweep oscilloscopes are particularly useful for this purpose they are not used extensively because the average television serviceman is not skilled in their use and, moreover, substantial time is required to set up the triggered sweeps for any particular application. For television servicing the oscilloscope must first of all be easy to operate and secondly the set up time must be short. Most triggered sweep oscilloscopes now on the market have neither of these necessary characteristics. While they have substantial flexibility and wide application they are essentially laboratory instruments requiring considerable skill to operate. Moreover, they are inherently slow to set up and are easily misadjusted. Even those oscilloscopes which have been designed primarily for television servicing cannot be operated by many servicemen who are untrained in the operation of triggered sweep oscilloscopes but are otherwise capable of servicing television equipment.

There is, therefore, a need for a triggered sweep oscilloscope which may be easily and quickly used by television service personnel for observing those waveforms normally encountered in television servicing. Rapid and precise switching from one triggered sweep to another should be simple and not require the operator to physically move from one place to another for setting up the most frequently used sweeps. For example, the use of rotary selector switches should be minimized because of the need for closely observing the dial while making the sweep selections. Also, all of the controls should be at the front of the instrument where they can be easily reached and observed and so that the instrument can be mounted on a shelf above the service bench.

SUMMARY OF THE INVENTION

Briefly, there is provided in accordance with the present invention an oscilloscope having sweep circuits triggered by the horizontal and vertical sync pulses of a standard television signal, which circuits are respectively selected by push button operated switches on the front panel of the instrument. In addition an adjustable, variable speed sweep and a 60 Hertz sweep also selected by a pair of push button operated switches are provided. The former sweep is adjustable by means of a rotary control which in one extreme position sets the sweep at the proper horizontal rate to view the color burst frequency. A fifth push button operated switch is used to control the oscilloscope from an externally applied sweep signal. These five push buttons are mechanically interlocked to enable facile, rapid and accurate switching from one sweep speed to another. Other controls for focus, horizontal and vertical positioning, gain and brightness are also provided on the front of the instrument.

BRIEF DESCRIPTION OF THE DRAWINGS

Further objects and advantages and a better understanding of the present invention can be had by reference to the following detailed description, wherein;

FIG. 3 is a block diagram showing the manner in which FIGS. 4, 5 and 6 are portions of a schematic circuit diagram of portions of the oscilloscope shown in FIG. 1 and embodying the present invention.

DETAILED DESCRIPTION OF THE INVENTION

Figure 1:
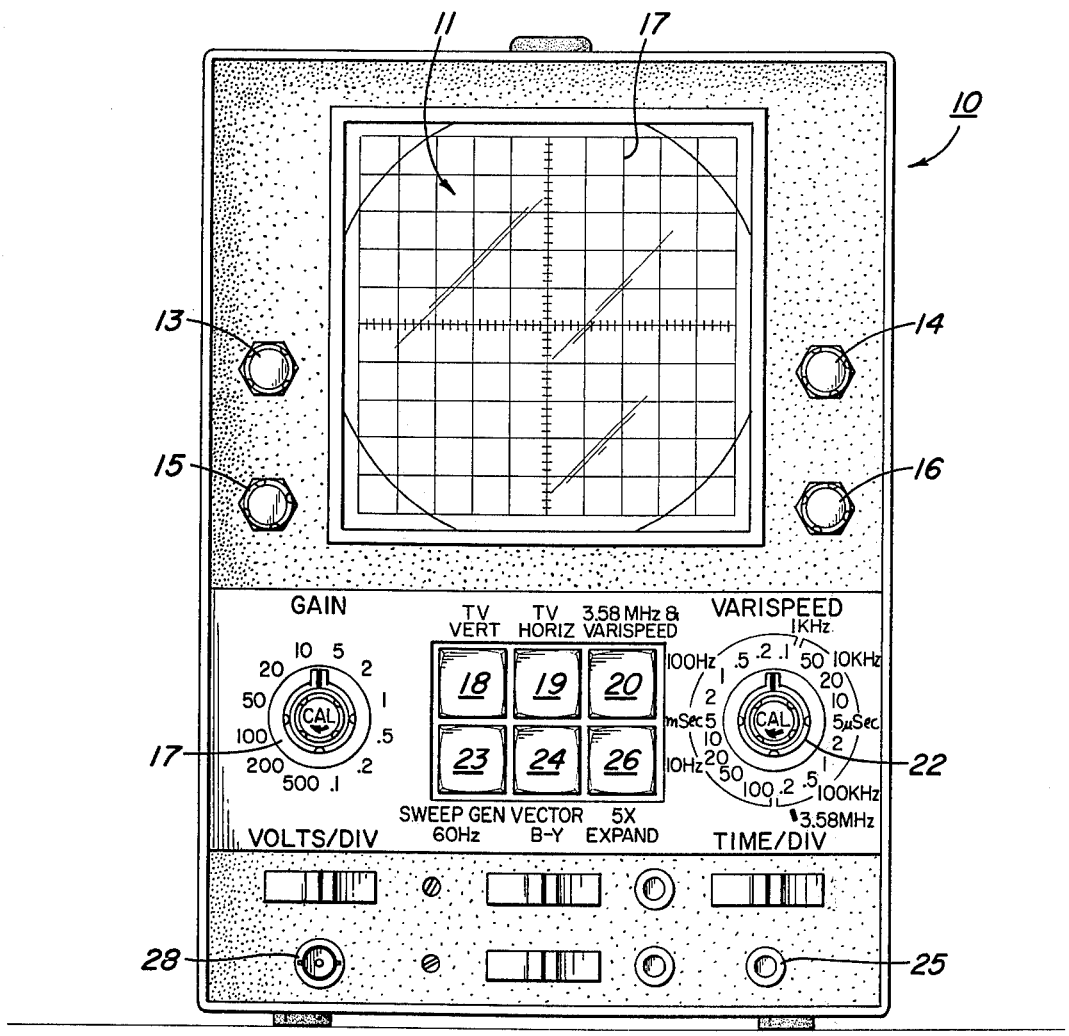
FIG. 1 is a front elevational view of an oscilloscope embodying the present invention.

Referring to FIG. 1 there is shown the front panel of an oscilloscope 10 embodying the present invention. In the upper portion it includes the screen 11 of a cathode ray tube, an intensity control 13, a focus control 14, a vertical position control 15 and a horizontal position control 16. Illuminated crosshatching or grid 17 is provided over the face of the screen to facilitate reading information values from the screen. To the left of the panel below the screen 11 is a gain control 21 for adjusting the vertical height of the waveform displayed on the screen.

At the center of the panel 10 below the screen 11 are six pushbutton switch actuators for selecting different operating modes of the oscilloscope. Actuation of a pushbutton 18 provides an internally triggered sweep one-half the standard vertical sweep rate of 60 Hz so as to display two cycles of the waveform to be observed. Actuation of a pushbutton 19 provides an internally triggered sweep one-half the standard horizontal sweep rate of 15750 Hz so as to display two cycles of the waveform to be observed. A pushbutton 20 is actuated to provide a sweep which is manually adjustable by means of a rotary control 22 hereinafter referred to as a varispeed control. At one extreme position of the varispeed control 22 a sweep triggered at the proper horizontal rate to view the color burst frequency of 3.58MHZ is provided. Another pushbutton 23 provides a sweep at 60 Hz and a pushbutton 24 permits use of the oscilloscope as a vector scope by connecting an externally generated sweep signal to the oscilloscope through a jack connector 25. These five pushbuttons are interconnected by any suitable means well known in the art such that actuation of any one releases any other one which was previously actuated. A sixth pushbutton 26 is independent of the other pushbuttons and increases the gain of the horizontal amplifier five times to provide a 5X expanded scale. An input jack connector 28 is provided near the lower left hand corner of the panel for coupling the waveform to be observed to the oscilloscope.

Figure 2:
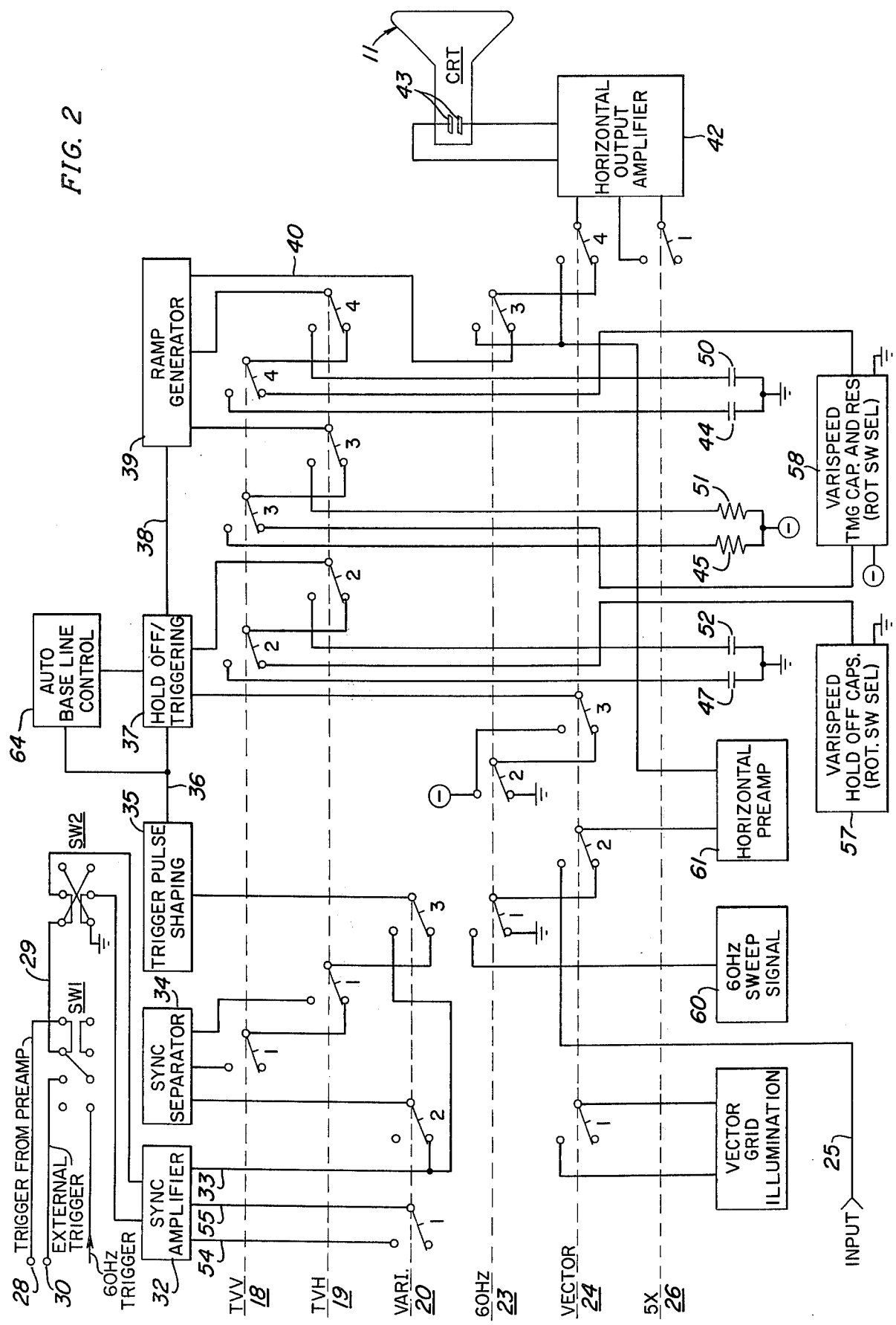
FIG. 2 is a block diagram of the triggered sweep circuits of the oscilloscope of FIG. 1.

Referring now to FIG. 2, wherein is shown only the sweep circuits of the oscilloscope, it will be understood by those skilled in the art that the input signal supplied to the input connector 28 is connected through a preamplifier to an input line 29 via a trigger source switch SW-1 and is also applied to the vertical plates of the oscilloscope for display thereof on the screen 11. A plurality of switches are ganged together in sets for actuation by the pushbuttons and the sets are respectively identified as S18, S19, S20, S23, S24 and S26 in correspondence with the pushbutton by which they are operated. The switches in each set are further identified, for example, as S18-1, S18-2 etc. for the TV vertical button operated switches and so on.

The signal input line 29 is energized through an input selector switch SW-1 and is connected via polarity switch SW-2 to a sync amplifier 32 which provides an amplified output on a conductor 33 connected to a normally closed contact of a switch S20-2 actuated by the varispeed pushbutton 20. The common contact of the switch S20-2 is connected to the input of a sync separator 34 having vertical sync pulse output connected to a normally open contact of a switch S18-1 and having a horizontal sync pulse output connected to a normally open contact of a switch S19-1. When, therefore, the pushbutton 18 is actuated to observe the input signal at the vertical rate, the vertical sync pulses are coupled through the switches S19-1 and S20-3 to a trigger pulse shaping circuit 35 which provides shaped vertical sync pulses in a conductor 36 connected to the input of a hold off trigger circuit 37 which provides trigger pulses on a conductor 38 connected to a ramp waveform generator circuit 39. The output of the ramp generator 39 is a sawtooth wave appearing on an output conductor 40 for connection through a switch S23-3 and a switch S24-4 to a horizontal amplifier 42. The output of the amplifier 42 is connected to the horizontal deflection plates 43 of the cathode ray tube. With the pushbutton 18 actuated the ramp generator timing circuits include a capacitor 44 connected to the ramp generator through S18-4 and S19-4 and a resistor 45 connected to the ramp generator through switches S18-3 and S19-3. These capacitor and resistor components cause the ramp generator to produce two cycles of the displayed sweep at the vertical sweep rate.

The hold off triggering circuit 37 is controlled by a capacitor 47 connected to the circuit 37 through switches S18-2 and S19-2 for the purpose of preventing the circuit from retriggering during the time the ramp generator is returning to its initial conditions after a sweep. Accordingly, by simply depressing the pushbutton 18 the horizontal sweep is automatically produced at one-half the vertical sweep rate and is triggered in synchronism with the vertical sync pulses of the composite TV signal to be observed.

In like manner, in order to observe the input signal at the horizontal sweep rate thereof, the pushbutton 19 is simply depressed. The sweep rate of the ramp generator is then controlled by a capacitor 50 and a resistor 51 and the hold off triggering circuit is timed by a capacitor 52. The amplified horizontal sync pulses from the sync separator 34 are coupled through switches S19-1 and S20-3 to the pulse shaping circuit 35 for triggering the ramp generator 39 in synchronism with the horizontal sync pulses in the composite input signal.

For general purpose triggering the pushbutton 20 is depressed which actuates the switch S20-1 to interconnect a pair of conductors 54 and 55 which increases the gain of the sync amplifier 32 to a maximum which causes the amplifier to be overdriven when the input signal exceeds a predetermined amplitude. When overdriven, the sync amplifier clips the input signal which is then coupled through switches S20-2 and S20-3 directly to the trigger pulse shaper 35 bypassing the sync separator. With the switches in the varispeed position the varispeed control 22 is positioned by the operator to select one of a set of capacitors 57 to control the hold off triggering circuit 37 and to select one of a plurality of pairs of timing capacitors and resistors 58 to adjust the frequency of the wave form generated by the ramp generator 39 in accordance with the time constant of the selected RC combination.

In order to provide a sweep at the line frequency of 60Hz the pushbutton 23 is depressed whereby a 60Hz source is connected through S23-1 and S24-2 to a horizontal preamplifier 61 whose output is coupled through S24-4 to the horizontal output amplifier 42. The triggering circuit is at this time disabled by connecting a negative voltage through switches S23-2 and S24-3 to the hold off triggering circuit 37.

In order to operate the scope in the vector mode, the pushbutton 24 is depressed which causes the vector grid 17 to be illuminated through switch S24-1 and the signal from the input jack connector 25 to be coupled through S24-2 to the horizontal preamplifier 61 for driving the horizontal amplifier 42 through the switch S24-4. The trigger circuits are disabled by connecting a negative voltage to the hold off triggering circuit 37 through the switch S24-3. The signal applied to the input 25 is now the horizontal sweep voltage and a vector relationship is established between the inputs applied to the horizontal and vertical deflection plates.

As described hereinabove, the pushbutton 26 is used to expand the display waveform in the horizontal direction by a factor of five. With the pushbutton 26 depressed the switch S26-1 functions to increase the gain of the horizontal output amplifier 42 by a factor of five. If, for example, a five cycle full screen display of the observed waveform had appeared on the screen, actuation of the pushbutton 26 would provide a one cycle display on the full screen.

In order to trigger the scope at line frequency the switch SW-1 is positioned at the central position to connect an internally generated 60Hz trigger signal to the input line 29. For external triggering the switch SW-1 is positioned to connect the external trigger input terminal 30 to the line 29.

In the absence of trigger pulses of suitable amplitude to synchronize the ramp waveform applied to the horizontal deflection plates, there is provided an automatic base line control circuit 64 which senses the absence of a trigger signal at the output of the trigger pulse shaper 35. When this condition is detected, the operating point of hold off trigger 37 is modified by the automatic base line control 64. As a consequence the ramp generator 39 operates in a free running mode to give a baseline reference.

Figure 4:
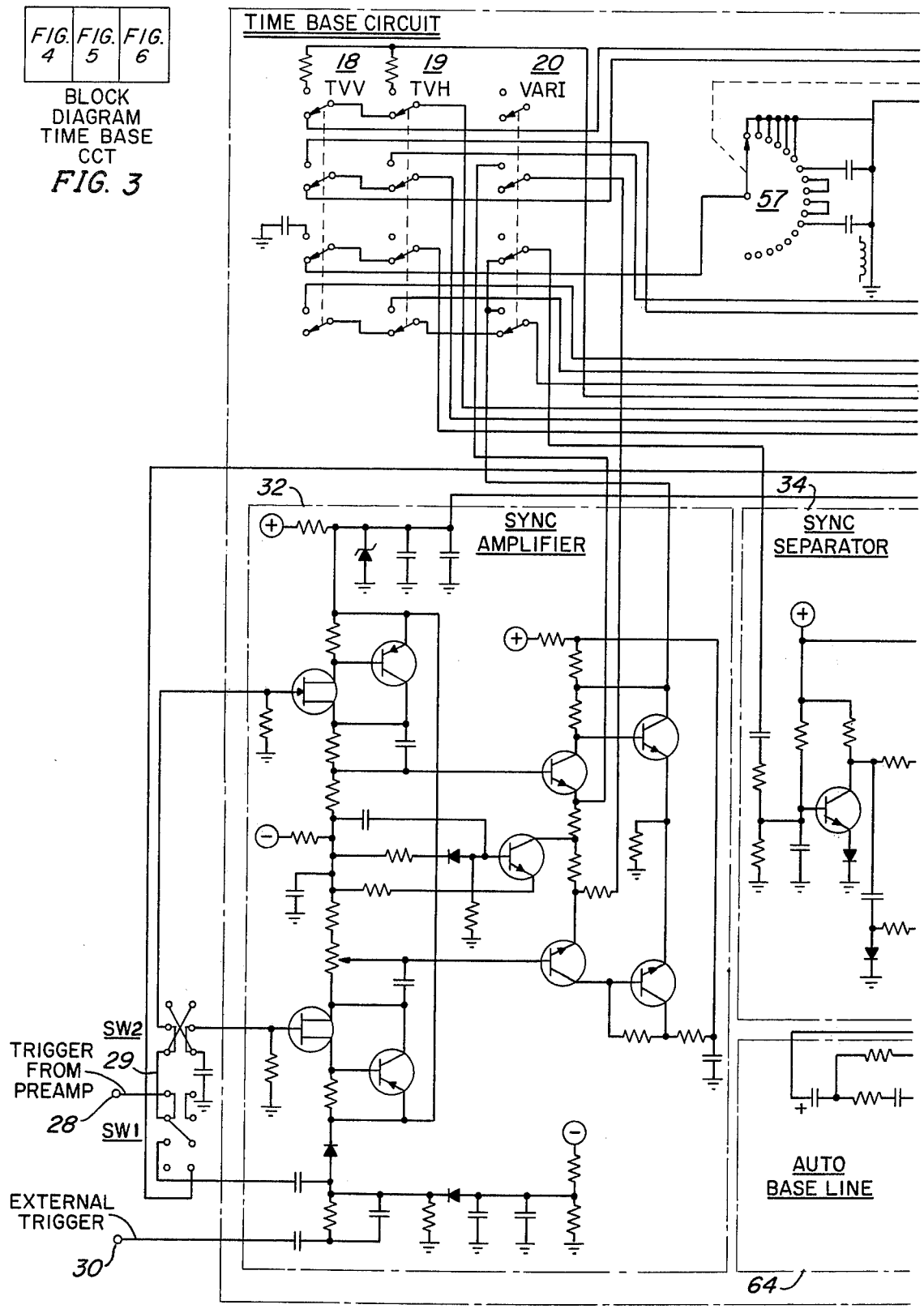
FIGS. 4, 5 and 6 are combined to form a schematic circuit diagram.
Figure 5:
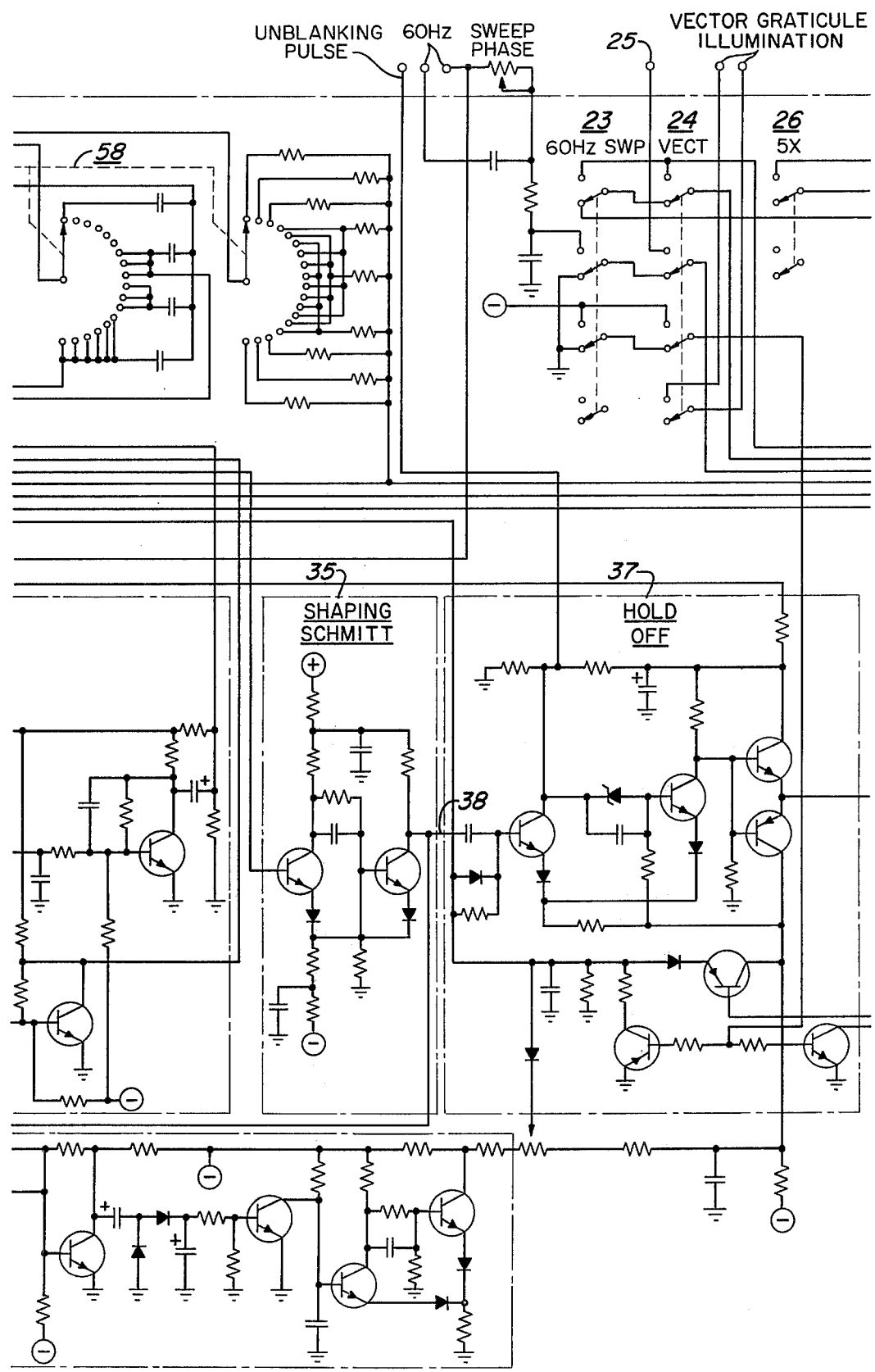
Figure 6:
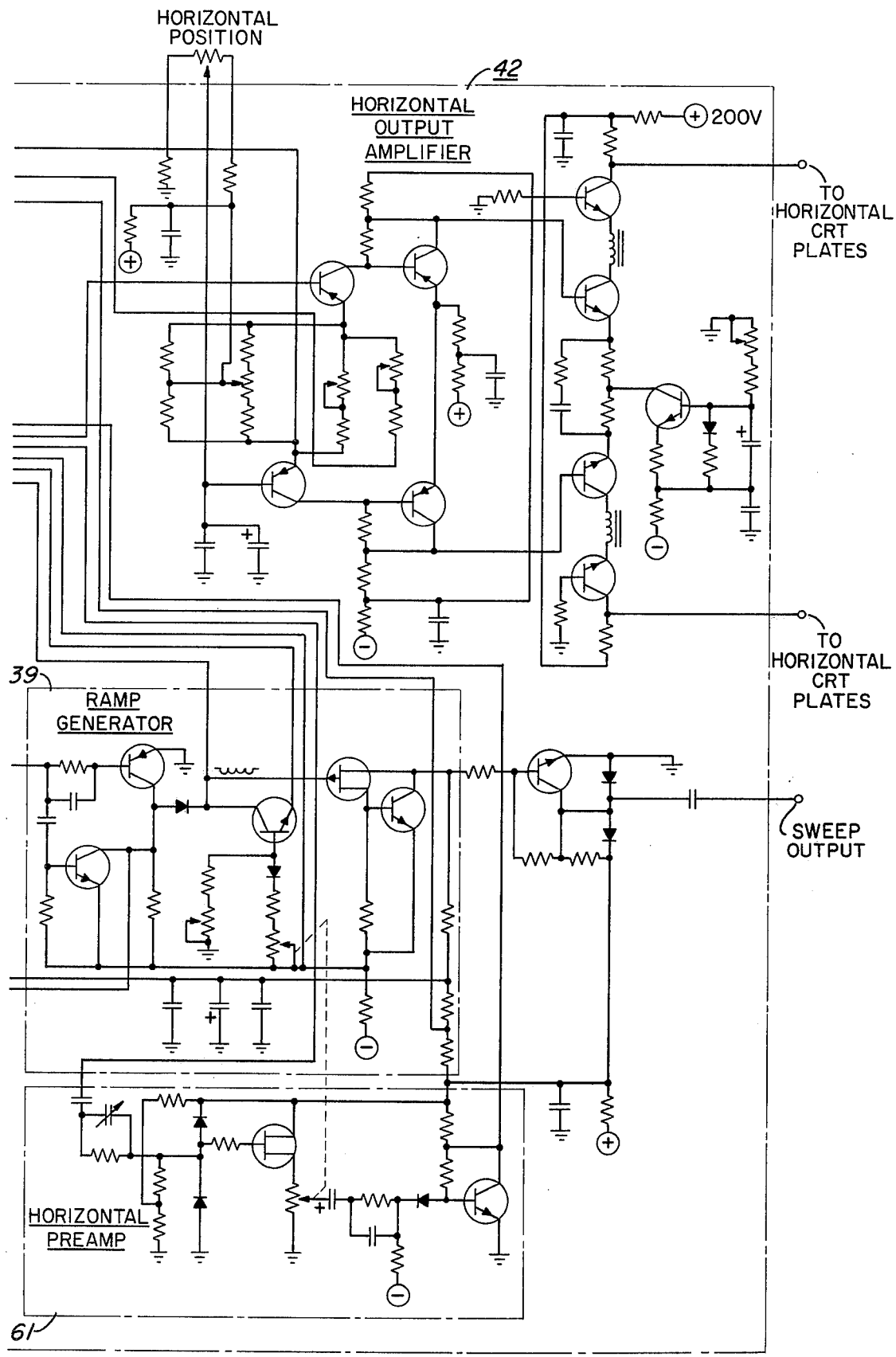

Referring now to FIGS. 4, 5 and 6, there is shown, in schematic form, suitable circuitry for use in the block diagram of FIG. 2. The circuitry used is well known to those skilled in the art wherefor a detailed description of this schematic diagram is unnecessary. It will be noted, however, that like parts in this schematic are identified by the same numbers in FIGS. 1 and 2.

In the circuit of FIGS. 4, 5 and 6 it will be noted that the external trigger terminal 30 is connected to the switch SW-1 through a protection circuit at the lower left of FIG. 4. The vector illumination input terminals at the upper right hand corner of FIG. 5 are for illuminating a graticule grid (not shown) overlying the screen 11 for use with a color bar generator for aligning the color circuits of the TV set. The sweep output at the right side of FIG. 6 is used for other tests such as, for example, as ringing the high voltage transformer to determine if the transformer windings are short circuited.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed:

1. An oscilloscope for use in television servicing, comprising
   an amplifier for amplifying a television signal,
   sync separator means coupled to the output of said amplifier for separating the horizontal and vertical sync pulses therefrom,
   said separator means having a first output at which said horizontal sync pulses appear and a second output at which said vertical sync pulses appear,
   trigger pulse shaping means,
   switch means for coupling the separated horizontal or vertical sync pulses to said trigger pulse shaping means or for coupling the output of said amplifier to said trigger pulse shaping means,
   a ramp wave generator,
   means coupling the output from said shaping means to said ramp generator to synchronize the ramp wave with the shaped pulses,
   means operative only when the output of said amplifier is connected to said trigger pulse shaping means for adjustably varying the speed of the ramp wave generated by said ramp wave generator, and
   means for driving one set of deflection plates in a cathode ray tube with said ramp wave.

2. An oscilloscope according to claim 1 comprising
   means causing said amplifier to be overdriven when the output of said amplifier is coupled to said trigger pulse shaping means, and to operate in a linear mode when said sync pulses are coupled to said trigger pulse shaping means.

3. An oscilloscope according to claim 2 wherein said switch means is pushbutton operated.

4. An oscilloscope according to claim 2 further comprising
   means for applying a 60 Hz sweep signal to said deflection plates and for simultaneously disconnecting the output of said ramp wave generator from said deflection plates.

5. An oscilloscope according to claim 4 further comprising
   means for coupling an external sweep signal to said deflection plates and for simultaneously disconnecting the output of said ramp wave generator from said deflection plates.

6. An oscilloscope according to claim 5 further comprising
   gain control means for increasing the gain of said ramp generating means a predetermined amount, said gain control means being pushbutton operated.

7. An oscilloscope according to claim 2 comprising
   timing circuit means responsive to said switching means for causing said ramp wave to be provided at the television horizontal sweep speed when said horizontal sync pulses are coupled to said trigger pulse shaping means and to be provided at the television vertical sweep speed when said vertical sync pulses are coupled to said trigger pulse shaping means.

8. An oscilloscope according to claim 7 comprising
   adjustable variable speed sweep means for manually varying the time base of said ramp wave only when the output of said amplifier is coupled to said trigger pulse shaping means.

* * * * *